United States Patent [19]
Veith

[11] Patent Number: 4,891,610
[45] Date of Patent: Jan. 2, 1990

[54] UHF-FEEDBACK OSCILLATOR

[75] Inventor: Peter E. Veith, Vienna, Austria

[73] Assignee: AKG Akustische u. Kino-Geräte Gesellschaft m.b.H., Wien, Austria

[21] Appl. No.: 311,699

[22] Filed: Feb. 16, 1989

[30] Foreign Application Priority Data

Feb. 17, 1988 [AU] Australia .................. 376/88

[51] Int. Cl.$^4$ .............................. H03B 5/18
[52] U.S. Cl. ..................... 331/96; 331/117 D; 331/135; 331/177 V
[58] Field of Search ............... 331/96, 117 D, 135, 331/107 DP; 333/202

[56] References Cited

U.S. PATENT DOCUMENTS

| | | | |
|---|---|---|---|
| 4,374,370 | 2/1983 | Popovski et al. | 333/202 |
| 4,459,571 | 7/1984 | Fraser | 333/202 |
| 4,630,002 | 12/1986 | Leiba | 331/96 |

FOREIGN PATENT DOCUMENTS 2245476 3/1974 Fed. Rep. of Germany.
3305453 8/1984 Fed. Rep. of Germany.

OTHER PUBLICATIONS

Pocketbook of High Frequency Technology (Taschenbuch der Hochfrequenztechnik), H. Meinke & F. W. Gundlach, pp. 1318-9, Springer-Verlag, Berlin 1956.

Primary Examiner—Siegfried H. Grimm
Attorney, Agent, or Firm—Toren, McGeady Associates

[57] ABSTRACT

A UHF-feedback oscillator for a frequency range of at least 300 MHz to 1000 MHz includes an amplifier stage, a voltage controlled tuning filter and a feedback quadripole. The feedback quadripole comprises a two- or three- loop helical waveguide resonator. Thus, the oscillator is easily adjustable to its oscillating condition within the very wideband frequency range of between 300 MHz and 1000 MHz and can be miniaturized in the simplest manner.

5 Claims, 3 Drawing Sheets

UHF-FEEDBACK OSCILLATOR

FIELD AND BACKGROUND OF THE INVENTION

The present invention is directed to a UHF-feedback oscillator for a frequency range of at least 300 MHz to 1000 MHz with an amplifier stage, a voltage controlled tuning filter and a feedback quadripole.

Oscillators of the above-mentioned type consist of an amplifier stage with amplification factor v and phase shift $\phi_v$, a voltage controlled tuning filter with damping k and phase cycle $\phi_N$, and a phase shifter with amplitude cycle m and phase shift $\phi_S$ arranged in a feedback path. In order that such a circuit arrangement functions as an oscillator, the voltage fed back to the oscillator input must coincide in value and in phase with the input voltage, or it must satisfy the following condition:

$$v.k.m. = 1 \phi_V + \phi_N + \phi_S = n.\pi (n = 0, 2, 4 \text{ etc.})$$

A feedback oscillator equipped with a feedback quadripole is known from German Patent Application DE-OS No. 33 05 453. The oscillator of this reference comprises a surface wave transmission line with a path range or transmission band corresponding to a predetermined oscillator frequency, and a 3 dB-90° coupler in the feedback path. The particular utilization of such an oscillator occurs in the transmission of digital signals with transmission velocities exceeding 100 Mbit/s.

Based on the given circuit structure, this oscillator generates a rectangular cycle signal up to a frequency of a maximum of 500 MHz where the possible frequency tuning range lies within ±100 KHz. The space requirement for this oscillator depends on the size of the surface wave transmission line (SAW-quadripole) which has a surface of several cm². In addition, the cost for such an oscillator is very high because SAW-quadripoles are expensive.

Another type of feedback oscillator is described in German Patent Application No. DE-AS 22 45 476. This oscillator is also intended for use as a timing or clock pulse oscillator in data processing installations. The working frequency of this oscillator can be up to 100 MHz. Band pass filters are utilized for positive feedback within the oscillator which are built up from logic building blocks. The oscillator frequency is determined either by LC (inductance, capacitance) circuits or by means of a crystal.

The best known and most used method for generating oscillations of the highest frequency in the frequency range above 300 MHz is achieved with a Colpitt circuit arrangement, where a fed back LC oscillation circuit is utilized as the frequency determining part. Frequency tuning is achieved by changing the inductance or capacitance. But reactances are changed at the same time if operating frequencies around 900 MHz are required. The quality of such an oscillator is usually relatively high, but the variable frequency range is very narrow and lies at approximately ±35%. The geometric structure of this oscillator requires a large space because of the inherent size of the individual electronic components. The Colpitt oscillator design is described in the German text, *Pocketbook of High Frequency Technology (Taschenbuch der Hochfrequenztechnik)*, by H. Meinke and F. W. Gundlach, Springer Edition, 1956 on pages 1318 and 1319.

A special disadvantage of known UHF-feedback oscillators is that variable frequency tuning is only possible within a comparatively narrow frequency range and miniaturization cannot be performed in view of the size of the components.

For the UHF range of approximately 4 to 22 GHz, an oscillator with a gyromagnetic resonator is known from U.S. Pat. No. 4,630,002. Such a resonator is based on the magnetic moment arising from the intrinsic rotation of electrons, wherein the interrelationship between matter and the electromagnetic field can occur only in those frequency ranges whose energy is sufficiently strong for this purpose. Such frequency ranges lie in the gigahertz range.

SUMMARY OF THE INVENTION

Proceeding from the state of the art, the goal of the present invention is to provide a UHF-feedback oscillator which can be miniaturized and which is adjustable over a very wide frequency range between approximately 300 MHz and 1000 MHz, while, at the same time, being very simple in construction.

According to the invention, a feedback oscillator of the previously mentioned type includes a feedback quadripole which comprises a two- or three- loop spiral waveguide resonator.

In a particularly expedient version of the UHF-feedback oscillator of the invention, the input terminal of a voltage controlled tuning filter is connected to the output of the amplifier stage. The output of the tuning filter is connected to the input of a resistive output network which has two outputs. One output of the resistive output network leads to the input of the two- or three-loop spiral waveguide resonator. The output of this resonator filter is connected to the input of the amplifier stage. Such a circuit arrangement constitutes the simplest conceivable arrangement for a feedback oscillator with feedback quadripole and permits the tapping of the electrical signal produced by the oscillator for further utilization at the output of the resistive output network.

The frequency determining portion of the oscillator in the invention is formed by the two- or three- loop spiral waveguide resonator which produces the respective adjustment of the phase condition in the feedback path required for the demanded working frequency. Because of this type of oscillation generation, the oscillating capability of the oscillator is assured within a very large frequency range which, for the case now considered, lies between 300 MHz and 1000 MHz. The spiral waveguide resonator is so small as far as its geometric dimensions are concerned, that it almost exclusively occupies the entire space requirement for the oscillator which corresponds to a surface of 1 to 1.5 cm² with a height of approximately 10 mm. These dimensions correspond entirely to the miniaturization of such a circuit arrangement. Compared with the structural size of a known high frequency oscillator including a coaxial line and a SAW-quadripole in its feedback path, the size of the oscillator of the invention is reduced by a factor of about 5 to 10 times. This, despite the fact that the known oscillator can only be varied within a very narrow frequency band of a maximum of ±30 MHz.

If one measures the values for overall phase rotation of the arrangement described below as a function of the frequency in a feedback oscillator consisting of a single step transistor amplifier in a common emitter circuit, a tuning filter and a matching circuit, then the result shows that these phase rotations lie between about +280° at 400 MHz and approximately +440° at 1000 MHz. In order that the phase rotation required for oscillator utilization of 0, 2π, 4π, etc. of the voltage fed back through the feedback path to the oscillator input is available, a phase rotating feedback quadripole, depending on the respective working frequency, is required, which rotates the phase precisely through the correct value. For this purpose, the spiral waveguide resonator with the previously mentioned properties represents the most efficient solution. Thanks to the uncomplicated construction of the overall circuit and the minimal measuring effort which is required for this purpose, an oscillator of the inventive type can be very economically fabricated with high quality and in mass production.

The phase angle rotation to be achieved with a helical waveguide resonator within its band pass range amounts to 0, 2π, 3π, etc., depending on the quantity of the filter circuits, whereby a phase relationship of the filter within the band pass range can always be found, for which an overall phase angle rotation of 0, 2π, 4π, etc. results from the sum of the phase shifts of the amplifier stage, the tuning filter and the resonator filter located in the feedback path. This means, in practical application, that a two-loop helical waveguide resonator is required for the frequency range of about 300 MHz to about 600 MHz and 600 MHz to about 1000 MHz and a three-loop helical waveguide resonator is required for the entire frequency range of 300 MHz to about 1000 MHz. An additional advantage of using a spiral waveguide resonator is that the input and output impedance of the helical waveguide resonator is selectable in a manner corresponding to the transistor parameter wherein impedance stages that would otherwise be required are eliminated.

Accordingly, one object of the present invention is to provide a UHF-feedback oscillator for a frequency range of from at least 300 MHz to 1000 MHz which comprises an amplifier stage, a voltage controlled tuning filter connected to the amplifier stage and a feedback quadripole connected between the amplifier stage and the filter. The feedback quadripole, according to the present invention, comprises a two- or three-loop helical waveguide resonator.

A further object of the present invention is to provide a UHF-feedback oscillator which is simple in design, rugged in construction and economical to manufacture, while being easily miniaturized and mass produced.

The various features of novelty which characterize the invention are pointed out with particularity in the claims annexed to and forming a part of this disclosure. For a better understanding of the invention, its operating advantages and specific objects attained by its use, reference should be had to the drawings and descriptive mater in which there is illustrated and described a preferred embodiment of the invention.

DESCRIPTION OF THE PREFERRED EMBODIMENT

Figure 1:
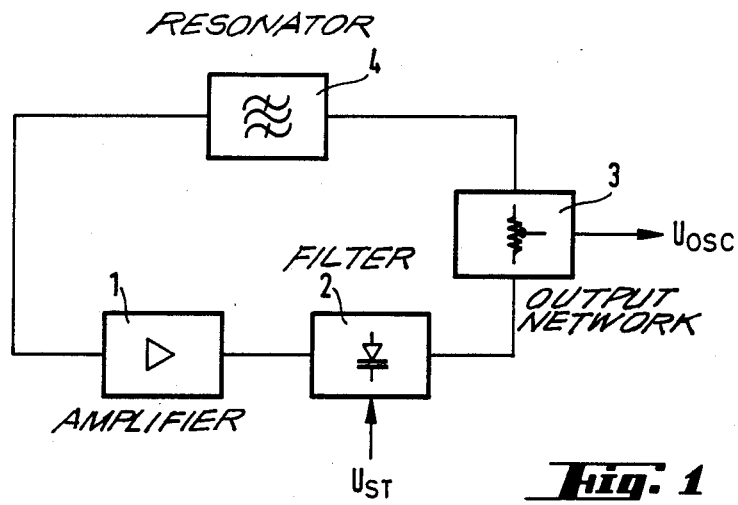
FIG. 1 is a circuit block diagram of a UHF oscillator of the present invention.

A UHF oscillator, according to the invention which is equipped with a spiral waveguide resonator in its feedback path, is shown as a circuit block diagram in FIG. 1. The circuit comprises a single stage, wide-band transistor amplifier 1 in common emitter connection, whose output is connected to the input of a voltage controlled tuning filter 2 operated by voltage $U_{ST}$. The fine trimming of the desired resonance or oscillator frequency and its maintenance at a constant value occurs by means of this tuning filter after free oscillation has been started by feedback of the signal to the amplifier input through a two- or three- loop helical waveguide resonator 4 located in the feedback path. The oscillator signal $U_{OSZ}$ is available at an output member 3 which consists of a simple network of ohmic resistances.

Figure 2:
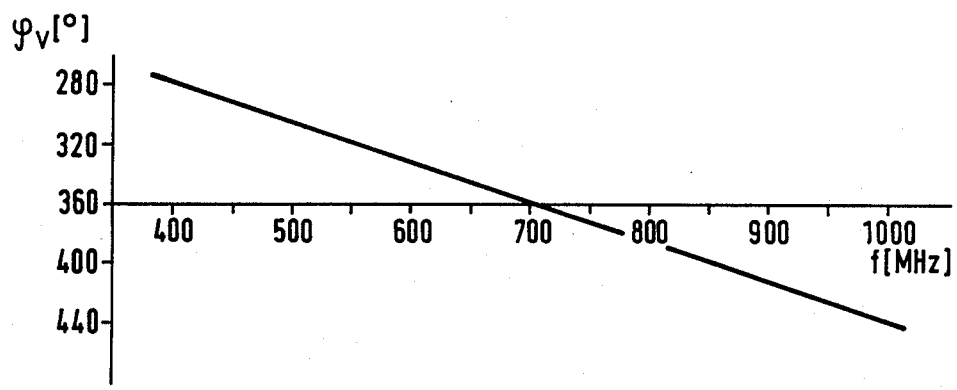
FIG. 2 is a graph plotting the phase cycle against the frequency of a UHF oscillator amplifier.

The phase angle rotation of a transistor amplifier, as a function of frequency, is not constant in the UHF range. FIG. 2 shows the deviations that occur in phase angle rotation within the frequency region of between 400 and 1000 MHz.

Figure 3:
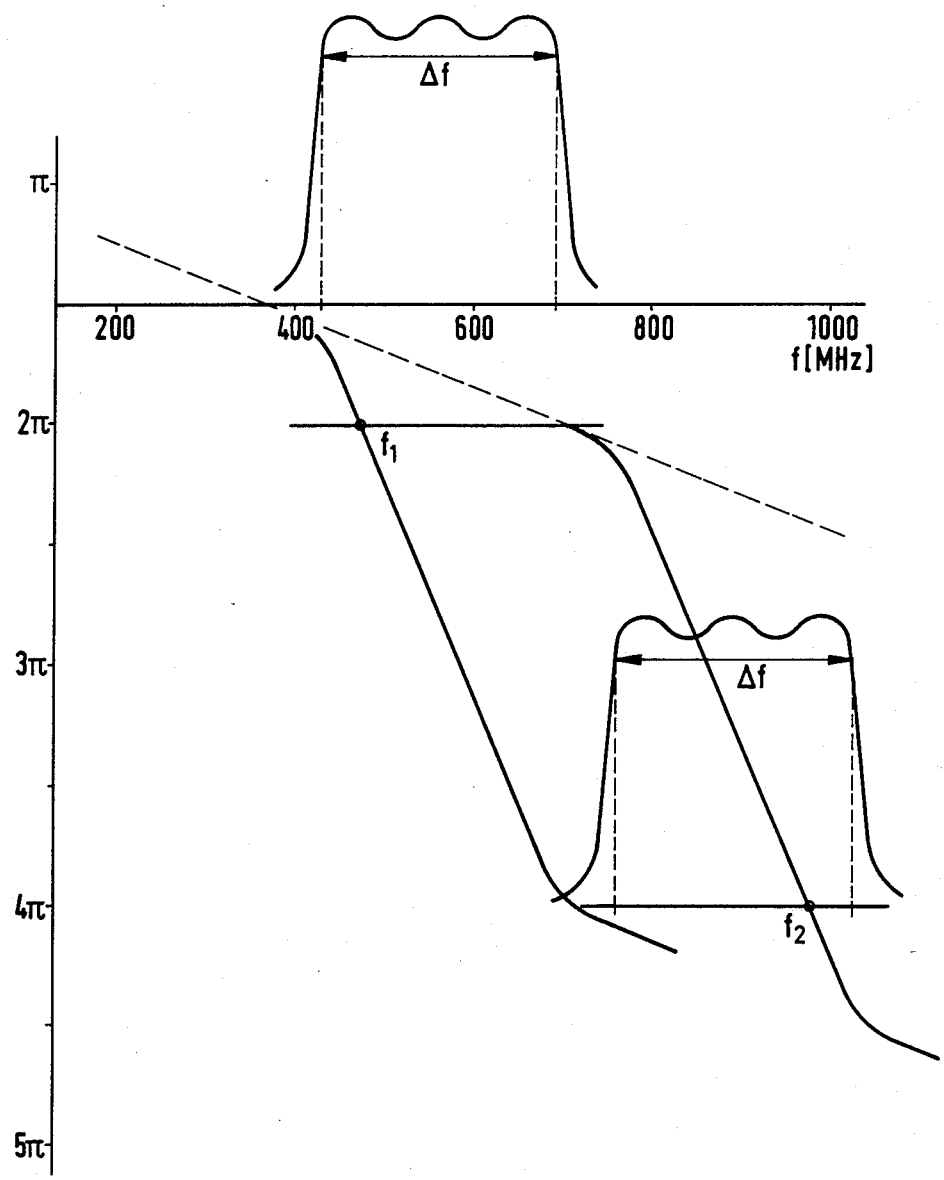
FIG. 3 is a diagram showing a mechanism for setting up the required phase condition according to the invention.

The mechanism for adjusting the phase condition required for the starting of oscillations at the oscillator is shown in the phase diagram of FIG. 3 for a three-loop resonator. The phase cycle of a helical waveguide resonator has a steep dropoff in its band pass range around a maximum of 2π. Thus, an explicit capture range always results, together with a phase shift of the oscillator amplifier and the tuning filter by which the oscillator oscillates in a stable manner. The oscillation frequency of the entire feedback system sets itself up at those points where the phase condition 0, 2π, 4π, etc. is satisfied. Fine tuning or trimming for the desired oscillator frequency in actual fact occurs in the frequency and phase determining components of the tuning filter.

Figure 4:
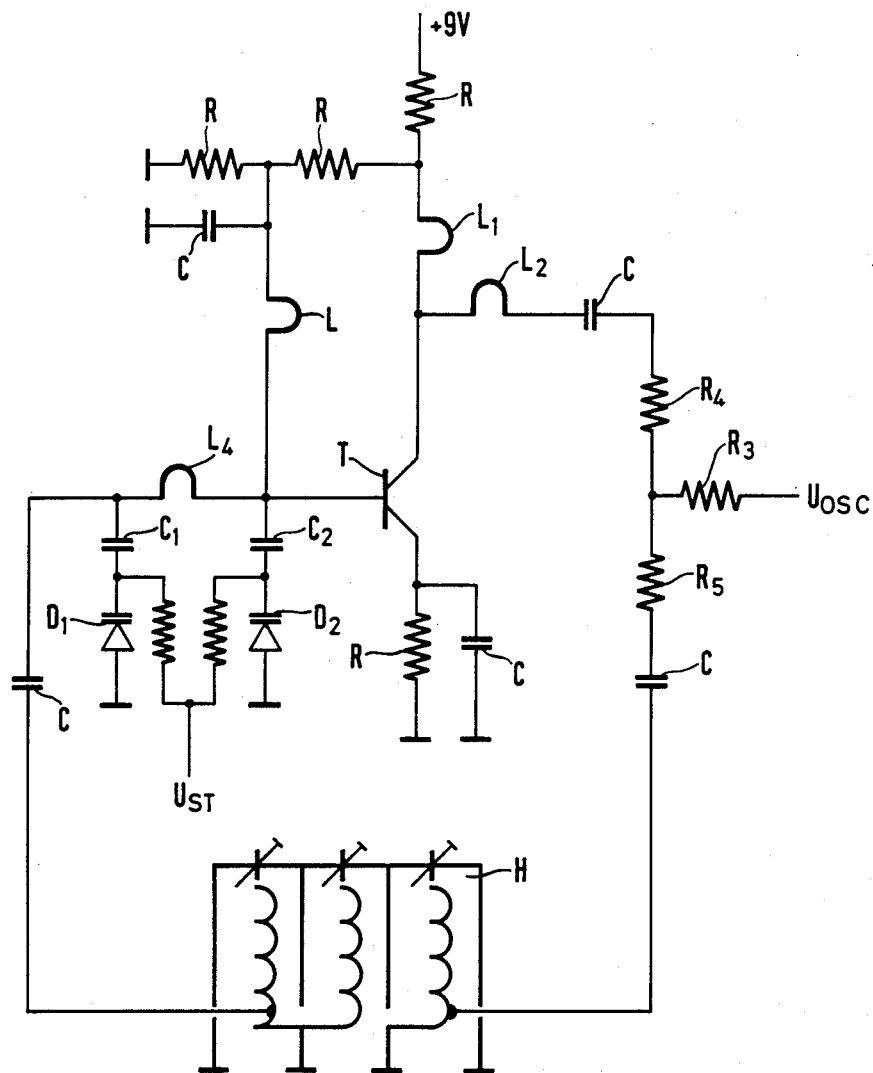
FIG. 4 is a schematic circuit diagram of a practical oscillator of the present invention.

A practical embodiment of the feedback oscillator of the invention is depicted in FIG. 4.

The oscillator amplifier comprises a transistor T in common emitter connection which functions as a single stage wide-band amplifier in the frequency range of 300 MHz to 1000 MHz. Inductance $L_1$ forms a load resistance for this transistor amplifier stage. This is followed by an inductance $L_2$ at the output of the amplifier stage for impedance matching with a resistive output member which comprises ohmic resistors $R_3$, $R_4$ and $R_5$. The resistor $R_5$ leads to the input of a three-loop helical waveguide resonator H (also called a helical filter) located in the feedback path. The output of resonator H leads to the input of a tuning filter. This filter is constructed as a π-member including an inductance $L_4$, capacitances $C_1$ and $C_2$ and capacitance or tuning diodes $D_1$ and $D_2$. The output of this π-member is connected to the input of the transistor amplifier stage at the base of the transistor T. The oscillator signal $U_{OSZ}$ is tapped at the resistor $R_3$ for further use. The remaining resistors R, inductances L and capacitors C additionally depicted in the drawing have the task of coupling the individual functional segments of the circuit arrangement so as to be free of DC current or to accomplish the filtering out of interfering frequency components in the supply voltage.

While a specific embodiment of the invention has been shown and described in detail to illustrate the application of the inventive principles, it will be understood that the invention may be embodied otherwise without departing from such principles.

What is claimed is:

1. A UHF-feedback oscillator for a frequency range of at least 300 MHz to 1000 MHz comprising an amplifier stage, a voltage controlled tuning filter connected to said amplifier stage and a feedback quadripole connected between said amplifier stage and said filter, said feedback quadripole comprising one of a two- and three-loop helical waveguide resonator.

2. A UHF-feedback oscillator according to claim 1, including a resistive output network having an input, said voltage controlled tuning filter having an input terminal connected to an output of said amplifier stage, said tuning filter having an output terminal connected to the input of said resistive output network, said output network having one output connected to an input of said resonator and another output for tapping an oscillator signal from said oscillator, said resonator having an output connected to an input of said amplifier stage.

3. A UHF-feedback oscillator, in particular for the frequency range of 300 MHZ to 1000 MHz, comprising a connected together amplifier stage, voltage controlled tuning filter and feedback quadripole, said quadripole comprising a two-loop waveguide resonator or a three-loop waveguide resonator.

4. An oscillator according to claim 3, including a resistive output network connected between said filter and said resonator, said network having one output for connection to said resonator and another output for tapping an oscillator signal from said oscillator.

5. An oscillator according to claim 4, wherein said amplifier stage comprises a single transistor, said tuning filter having an output connected to the base of said transistor, said resistive output network being connected to one of the emitter and collector of said transistor, said tuning filter having an input connected to an output of said resonator, said resistive output network having one output connected to an input of said resonator.

* * * * *

UNITED STATES PATENT AND TRADEMARK OFFICE
CERTIFICATE OF CORRECTION

PATENT NO. : 4,891,610

DATED : January 2, 1990

INVENTOR(S) : Peter E. Veith

It is certified that error appears in the above-identified patent and that said Letters Patent is hereby corrected as shown below:

On the title page, item [30], should read

--[30] Foreign Application Priority Data
      February 17, 1988[AU]  Austria.............376/88--.

Signed and Sealed this

Twenty-fifth Day of December, 1990

*Attest:*

HARRY F. MANBECK, JR.

*Attesting Officer*      *Commissioner of Patents and Trademarks*

UNITED STATES PATENT AND TRADEMARK OFFICE
CERTIFICATE OF CORRECTION

PATENT NO. : 4,891,610

DATED : January 2, 1990

INVENTOR(S) : Peter E. Veith

It is certified that error appears in the above-identified patent and that said Letters Patent is hereby corrected as shown below:

On the title page, the foreign priority data should read

--[30]   Foreign Application Priority Data
        February 17, 1988 [AT]  Austria.............376/88--

This certificate supersedes Certificate of Correction issued December 25, 1990

Signed and Sealed this

Sixteenth Day of April, 1991

*Attest:*

HARRY F. MANBECK, JR.

*Attesting Officer*    *Commissioner of Patents and Trademarks*